(12) United States Patent
Lee et al.

(10) Patent No.: US 8,824,220 B2
(45) Date of Patent: Sep. 2, 2014

(54) SEMICONDUCTOR APPARATUS

(71) Applicant: SK hynix Inc., Icheon-si (KR)

(72) Inventors: Hyun Joo Lee, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 13/736,138

(22) Filed: Jan. 8, 2013

(65) Prior Publication Data
US 2014/0063926 A1    Mar. 6, 2014

(30) Foreign Application Priority Data
Aug. 29, 2012   (KR) .................. 10-2012-0095211

(51) Int. Cl.
*G11C 7/00* (2006.01)
*G11C 13/00* (2006.01)
*G11C 7/06* (2006.01)
*G11C 7/08* (2006.01)

(52) U.S. Cl.
CPC .............. *G11C 7/06* (2013.01); *G11C 13/0009* (2013.01); *G11C 7/08* (2013.01)
USPC ..................................... 365/189.11

(58) Field of Classification Search
CPC ..... G11C 7/22; G11C 7/1051; G11C 11/5642
USPC ................................... 365/189.011
See application file for complete search history.

(56) References Cited

U.S. PATENT DOCUMENTS 7,839,713 B1 * 11/2010 Yu et al. .................. 365/230.05

FOREIGN PATENT DOCUMENTS

| KR | 1020090050044 A | 5/2009 |
| KR | 100924206 B1 | 10/2009 |

* cited by examiner

*Primary Examiner* — Anthan Tran
(74) *Attorney, Agent, or Firm* — William Park & Associates Ltd.

(57) ABSTRACT

A semiconductor apparatus includes: a sense amplifier unit enabled for a predetermined time during a read operation in response to a first read enable signal, enabled before a write operation in response to a second read enable signal, and disabled when the write operation is started, and a switch unit configured to connect a write driver and a memory unit during the write operation in response to a first select signal, connect the sense amplifier unit and the memory unit for the predetermined time during the read operation in response to a control signal, and disconnect the sense amplifier and the memory unit when the write operation is started.

13 Claims, 2 Drawing Sheets ically involves the amplifier unit 120 is enabled during a read operation of the semiconductor apparatus 100 and configured to output data stored in the memory unit 150 via the switch unit

SEMICONDUCTOR APPARATUS

CROSS-REFERENCES TO RELATED APPLICATION

The present application claims priority under 35 U.S.C. §119(a) to Korean application number 10-2012-0095211, filed on Aug. 29, 2012, in the Korean Intellectual Property Office, which is incorporated herein by reference in its entirety.

BACKGROUND

1. Technical Field

The present invention relates generally to a semiconductor apparatus, and more particularly, to a phase change random access memory (PCRAM).

2. Related Art

A PCRAM is a nonvolatile memory apparatus which programs a resistive memory cell through a programming current pulse. The PCRAM stores data using a phase change of the phase change material depending on a temperature condition. In other words, a resistance change is introduced via a phase change of a phase change material.

The phase change material may include a material which can transition into an amorphous state or crystalline state depending on a temperature condition. A representative example of the phase change material may include chalcogenide alloys such as Ge2Sb2Te5 (GST) using germanium (Ge), antimony (Sb), and tellurium (Te). Therefore, the phase change material is generally referred to as GST.

The PCRAM causes a reversible phase change between the crystalline state and the amorphous state of GST, using Joule heat generated after applying a current or voltage under a specific condition for GST. In general, the crystalline state is referred to as a set state, and GST in the set state exhibits electrical characteristics similar to a metal with low resistance. Furthermore, the amorphous state is referred to as a reset state, and a current flowing in GST in the reset state or a corresponding voltage change based on the current change is sensed to determine stored data. In general, the set state is defined to have a logic level of '0', and the reset state is defined to have a logic level of '1'. Although power is cut off, due to its nonvolatile nature, GST continuously maintains its state.

FIG. 1 is a diagram illustrating a conventional PCRAM 10.

Referring to FIG. 1, the conventional PCRAM 10 includes a write driver 11, a sense amplifier unit 12, a switch unit 13, and a memory unit 14. The memory unit 14 includes a phase change element 141 and a diode 142.

Referring to FIG. 1, a write operation of the conventional PCRAM 10 will be described as follows.

During the data write operation of the conventional PCRAM 10, the write driver 11 is enabled to supply a program current I_PGM (not shown) to the switch unit 13.

During the data write operation of the conventional PCRAM 10, a first select signal GYSWP transits to a low level to form a current path through which the program current I_PGM is passed from the write driver 11 toward the memory unit 14.

In order to improve the drivability of the write driver 11 during the data write operation of the PCRAM 10, a current outputted from the sense amplifier unit 12 is used to precharge a bit line BL (not shown). A second select signal GYSWN in a logic high state may then be applied to the switch unit 13 to form a current path between the sense amplifier unit 12 and the memory unit 14.

In the conventional PCRAM 10, however, parasitic capacitance may accrue in the current path during the write operation. Therefore, it may take a long time to store data in the memory unit 14, and a fail bit may occur when data is stored.

SUMMARY

In an embodiment of the present invention, a semiconductor apparatus includes: a sense amplifier unit enabled for a predetermined time during a read operation in response to a first read enable signal, enabled before a write operation in response to a second read enable signal, and disabled when the write operation is started, and a switch unit configured to connect a write driver and a memory unit during the write operation in response to a first select signal, connect the sense amplifier unit and the memory unit for the predetermined time during the read operation in response to a control signal, and disconnect the sense amplifier and the memory unit when the write operation is started.

In another embodiment of the present invention, a semiconductor apparatus includes: a switch unit configured to control a first current path where a write driver and a memory unit are connected during a write operation in response to a first select signal and a control signal, and control a second current path where a sense amplifier unit and the memory unit are connected for a predetermined time during a read operation and then disconnected when the write operation is started, and a control unit configured to output the control signal in response to a first read enable signal and a second select signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various embodiments.

Figure 1:
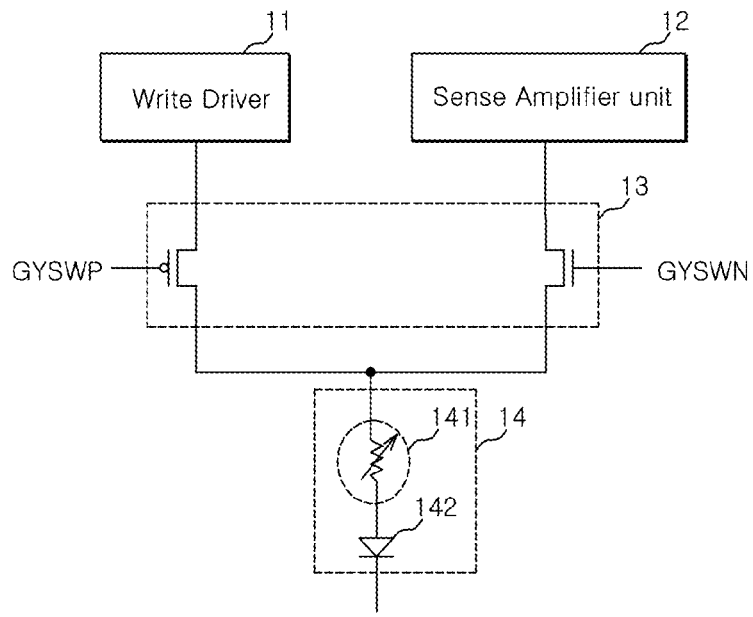
FIG. 1 is a diagram illustrating a conventional PCRAM.
Figure 2:
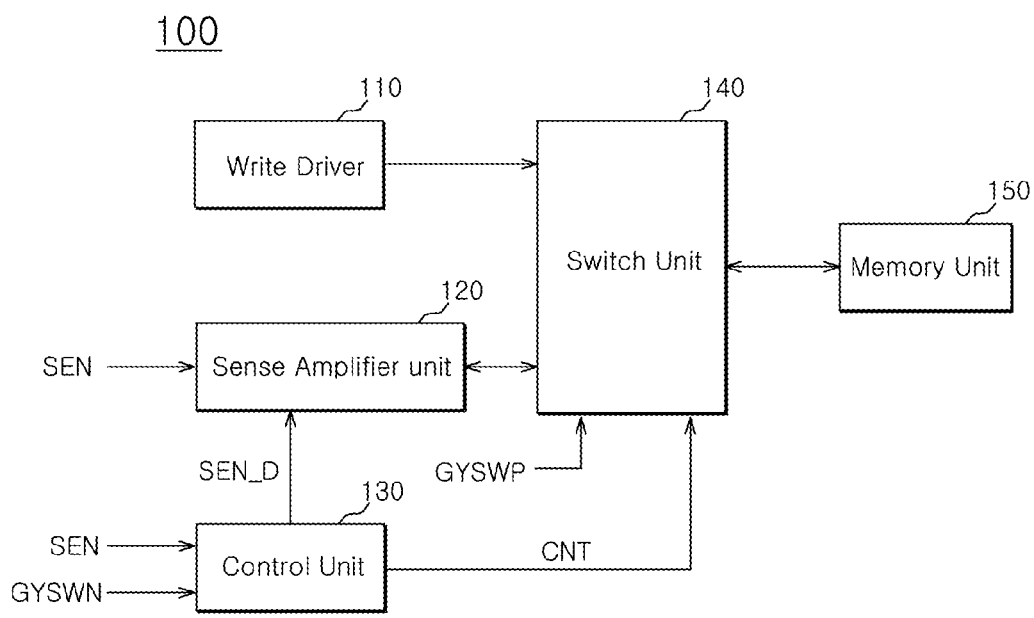
FIG. 2 is a schematic block diagram of a semiconductor apparatus according to an embodiment of the present invention.

FIG. 2 is a schematic block diagram of a semiconductor apparatus 100 according to an embodiment of the present invention.

Referring to FIG. 2, the semiconductor apparatus 100 according to an embodiment of the present invention will be described as follows.

The semiconductor apparatus 100 according to an embodiment of the present invention includes a write driver 110, a sense amplifier unit 120, a control unit 130, a switch unit 140, and a memory unit 150.

The write driver 110 is enabled during a write operation of the semiconductor apparatus 100 and configured to supply data to the memory unit 150 via the switch unit 140.

The sense amplifier unit 120 is enabled during a read operation of the semiconductor apparatus 100 and configured to output data stored in the memory unit 150 via the switch unit

140. The sense amplifier unit 120 is configured to sense and amplify data in response to first and second read enable signals SEN and SEN_D.

The control unit 130 is configured to receive the first read enable signal SEN and a second select signal GYSWN, and output the second read enable signal SEN_D and a control signal CNT. Specifically, the control unit 130 outputs the second read enable signal SEN_D by delaying the first read enable signal SEL by a predetermined time, and outputs the control signal CNT by performing a logic operation on the first and second read enable signals SEN and SEN_D.

The switch unit 140 is configured to connect the write driver 110 and the sense amplifier unit 120 to the memory unit 150 in response to the first select signal GYSWP and the control signal CNT during both a write or read operation. The switch unit 140 connects the write driver 110 and the sense amplifier unit 120 to the memory unit 150 when the first select signal GYSWP and the control signal CNT are enabled.

During the write operation of the semiconductor apparatus 100, the first select signal GYSWP transits to a logic low level, and during the read operation of the semiconductor apparatus 100, the second select signal GYSWN transits to a logic high level. In other words, during the write operation of the semiconductor apparatus 100, the first select signal GYSWP is enabled to a state in which the first select signal GYSWP has a logic low level, and during the read operation of the semiconductor apparatus 100, the second select signal GYSWN is enabled to a state in which the second select signal GYSWN has a logic high level.

The first read enable signal SEN is enabled for a predetermined time during the read operation of the semiconductor apparatus 100. When the first read enable signal SEN is enabled, the sense amplifier unit 120 senses and amplifies data received from the memory unit 150 via the switch unit 140.

The control unit 130 generates the second read enable signal SEN_D by delaying the first read enable signal SEN by a predetermined time. The control unit 130 delays the first read enable signal SEN until the first select signal GYSWP is enabled.

The control unit 130 outputs the control signal CNT by performing a logic operation on the second select signal GYSWN and the first read enable signal SEN. The control unit 130 then enables the control signal CNT when the second select signal GYSWN or the first read enable signal SEN is enabled.

The switch unit 140 connects the write driver 110 and the memory unit 150 when the enabled first select signal GYSWP is inputted, and connects the sense amplifier unit 120 and the memory unit 150 when the enabled control signal CNT is inputted.

The control signal CNT may not only be enabled state during the read operation of the semiconductor apparatus 100. It may also be enabled when the first select signal GYSWP is enabled.

In other words, the semiconductor apparatus 100 drives the sense amplifier unit 120 and connects the sense amplifier unit 120 to the memory unit 150, in response to the second read enable signal SEN_D and the control signal CNT which are enabled when the write operation is started. The semiconductor apparatus 100 may drive the sense amplifier unit 120 when the write operation is started, in order to improve the voltage drivability during the write operation.

Figure 3:
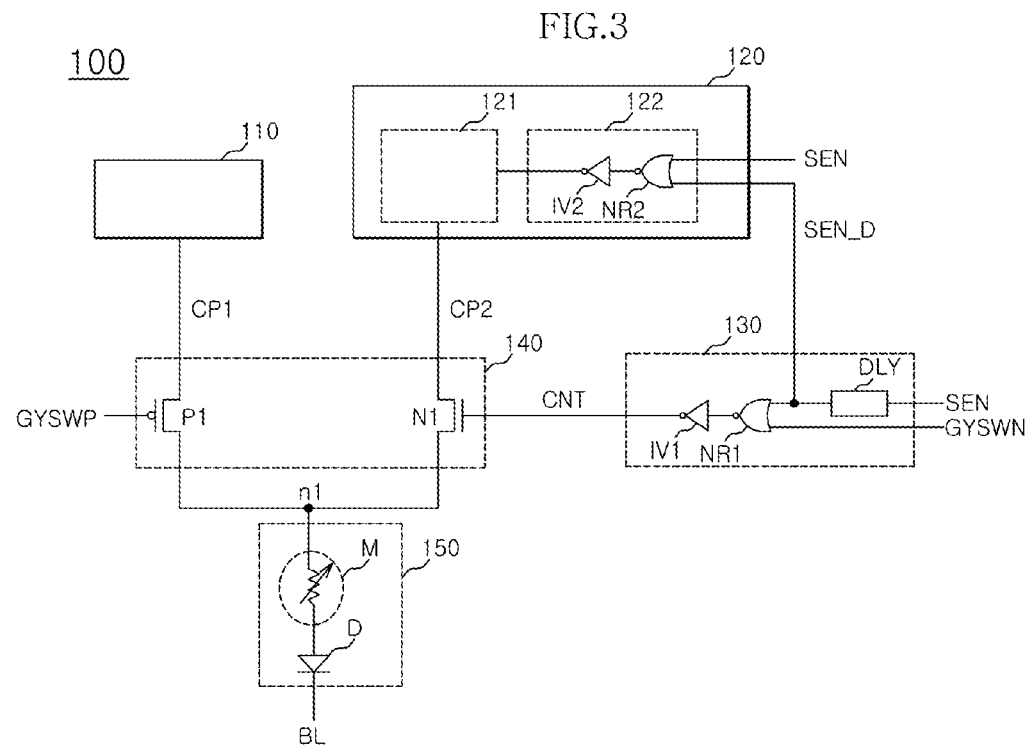
FIG. 3 is a circuit diagram of the semiconductor apparatus according to an embodiment of the present invention.

FIG. 3 is a circuit diagram of the semiconductor apparatus 100 according to an embodiment of the present invention.

Referring to FIG. 3, the semiconductor apparatus 100 according to an embodiment of the present invention will be described as follows.

The semiconductor apparatus 100 includes the write driver 110, the sense amplifier unit 120, the control unit 130, the switch unit 140, and the memory unit 150.

The sense amplifier unit 120 includes a sense amplifier 121 and a signal combination section 122. The signal combination section 122 includes a second NOR gate NR2 and a second inverter IV2. The second NOR gate NR2 is configured to perform a logic operation on the first and second read enable signals SEN and SEN_D, and the second inverter IV2 is configured to invert an output signal of the second NOR gate NR2. The sense amplifier 121 is enabled in response to an output signal of the signal combination section 122.

The control unit 130 includes a delay section DLY, a first NOR gate NR1, and a first inverter IV1. The delay section DLY is configured to delay the first read enable signal SEN by a predetermined time and output the second enable signal SEN_D. The first NOR gate NR1 is configured to perform a logic operation on the second read enable signal SEN_D and the second select signal GYSWN. The first inverter IV1 is configured to invert an output signal of the first NOR gate NR1 and output the control signal CNT.

The switch unit 140 includes a first PMOS transistor P1 and a first NMOS transistor N1. The first PMOS transistor P1 is connected between the write driver 110 and a first node n1 and configured to receive the first select signal GYSWP. The first NMOS transistor N1 is connected between the sense amplifier unit 120 and the first node n1 and configured to receive the control signal CNT.

The switch unit 140 further includes a first current path CP1 and a second current path CP2. The first current path CP1 connects the write driver 110 and the memory unit 150 via the first PMOS transistor P1, and the second current path CP2 connects the sense amplifier unit 120 and the memory unit 150 via the first NMOS transistor N1.

The switch unit 140 connects the first current path CP1 in response to the first select signal GYSWP during the write operation, and connects the second current path CP2 in response to the control signal CNT when the read operation and the write operation are started.

The memory unit 150 includes a phase change element M and a diode D.

Figure 4:
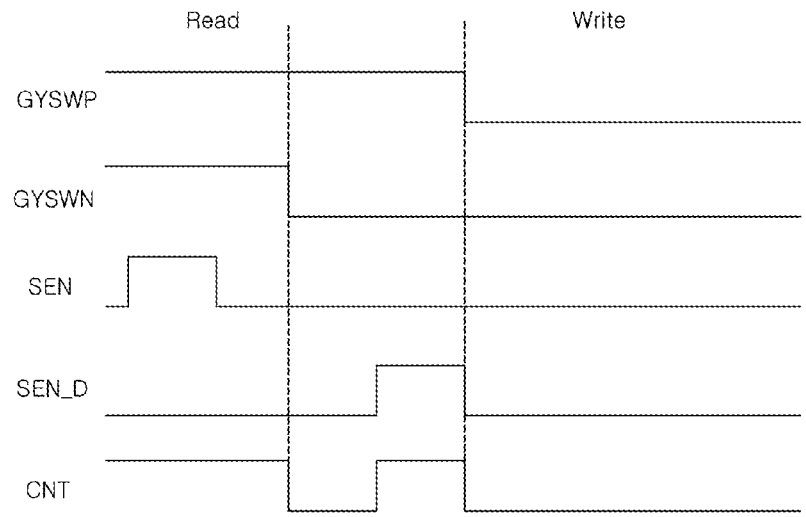
FIG. 4 is a timing diagram of the semiconductor apparatus according to an embodiment of the present invention.

FIG. 4 is a timing diagram of the semiconductor apparatus 100 according to an embodiment of the present invention.

Referring to FIGS. 3 and 4, the operation of the semiconductor apparatus 100 according to an embodiment of the present invention will be described as follows.

During the read operation, the first select signal GYSWP is disabled, and the second select signal GYSWN is enabled. The first read enable signal SEN is enabled for a predetermined time. The disabled state of the first select signal GYSWP corresponds to a logic high state, and the enabled state of the first select signal GYSWP corresponds to a logic low state. Furthermore, the enabled state of the second select signal GYSWN corresponds to a logic high state, and the disabled state of the second select signal GYSWN corresponds to a logic low state.

During the read operation of the semiconductor apparatus 100, the control unit 130 performs a logic operation on the second select signal GYSWN and the second read enable signal SEN_D obtained by delaying the first read enable signal SEN enabled for a predetermined time, and enables the control signal CNT. The enabled state of the control signal CNT corresponds to a logic high state, and the disabled state of the control signal CNT corresponds to a logic low state.

Therefore, during the read operation, the switch unit 140 disconnects the write driver 110 and the memory unit 150 and connects the sense amplifier unit 120 and the memory unit 150 to output data stored in the memory unit 150, in response to the enabled control signal CNT and the disabled first select signal GYSWP.

During the write operation, the first and second select signals GYSWP and GYSWN become logic low. The control unit 130 generates the second read enable signal SEN_D by delaying the first read enable signal SEN by a predetermined time. The first read enable signal SEN is then delayed until the write operation is started after the read operation of the semiconductor apparatus 100. In other words, the first read enable signal SEN is delayed until the first select signal GYSWP transits after the read operation of the semiconductor apparatus 100.

The control unit 130 performs a logic operation on the second read enable signal SEN_D and the second select signal GYSWN through the first NOR gate NR1. Furthermore, the control unit 130 inverts an output signal of the first NOR gate NR1 through the first inverter IV1, and outputs the inverted signal as the control signal CNT. That is, the control unit 130 performs an OR operation on the second read enable signal SEN_D and the second select signal GYSWN and outputs the control signal CNT. The control signal CNT is then enabled for a predetermined time before the write operation of the semiconductor apparatus 100 is started.

The signal combination section 122 of the sense amplifier unit 120 performs a logic operation on the first and second read enable signals SEN and SEN_D, and the sense amplifier 121 is driven in response to an output signal of the signal combination section 122.

Therefore, immediately before the write operation, the switch unit 140 disconnects the write driver 110 and the memory unit 150 and connects the sense amplifier unit 120 and the memory unit 150 to precharge the semiconductor apparatus 100, in response to the control signal CNT enabled for a predetermined time and the disabled first select signal GYSWP.

During the write operation, the switch unit 140 connects the write driver 110 and the memory unit 150 to store data in the memory unit 150 and disconnects the sense amplifier unit 120 and the memory unit 150, in response to the disabled control unit CNT and the enabled first select signal GYSWP.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a sense amplifier unit enabled for a predetermined time during a read operation in response to a first read enable signal, enabled before a write operation in response to a second read enable signal, and disabled when the write operation is started;
    a switch unit configured to connect a write driver and a memory unit during the write operation in response to a first select signal, connect the sense amplifier unit and the memory unit for the predetermined time during the read operation in response to a control signal, and disconnect the sense amplifier and the memory unit when the write operation is started, and
    a control unit configured to generate the control signal and the second read enable signal in response to the first read enable signal and a second select signal.

2. The semiconductor apparatus according to claim 1, wherein the control unit generates the second read enable signal by delaying the first read enable signal.

3. The semiconductor apparatus according to claim 2, wherein the first select signal comprises a signal enabled during a write operation.

4. The semiconductor apparatus according to claim 3, wherein the second select signal comprises a signal enabled during a read operation.

5. The semiconductor apparatus according to claim 4, wherein the control unit performs a logic operation on the second read enable signal and the second select signal, and outputs the control signal.

6. The semiconductor apparatus according to claim 2, wherein the sense amplifier unit comprises:
    a signal combination section configured to perform a logic operation on the first and second read enable signals; and
    a sense amplifier connected to the memory unit in response to an output signal of the signal combination section.

7. The semiconductor apparatus according to claim 1, wherein the memory unit comprises a phase change memory element.

8. The semiconductor apparatus according to claim 1, wherein the sense amplifier unit comprises:
    a signal combination section configured to perform a logic operation on the first and second read enable signals; and
    a sense amplifier connected to the memory unit in response to an output signal of the signal combination section.

9. The semiconductor apparatus according to claim 8, wherein the memory unit comprises a phase change memory element.

10. A semiconductor apparatus comprising:
    a switch unit configured to control a first current path where a write driver and a memory unit are connected during a write operation in response to a first select signal and a control signal and control a second current path where a sense amplifier unit and the memory unit are connected for a predetermined time during a read operation and then disconnected when the write operation is started; and
    a control unit configured to output the control signal in response to a first read enable signal and a second select signal,
    wherein the control unit generates the second read enable signal by delaying the first read enable signal.

11. The semiconductor apparatus according to claim 10, wherein the first select signal comprises a signal enabled during a write operation.

12. The semiconductor apparatus according to claim 11, wherein the second select signal comprises a signal enabled during a read operation.

13. The semiconductor apparatus according to claim 12, wherein the control unit performs a logic operation on the second read enable signal and the second select signal, and outputs the control signal.

* * * * *